United States Patent [19]
Uemura

[11] Patent Number: 4,884,869
[45] Date of Patent: Dec. 5, 1989

[54] FLY'S EYE LENS UNIT FOR ILLUMINATION SYSTEM

[75] Inventor: Haruo Uemura, Kyoto, Japan

[73] Assignee: Dainippon Screen Mfg., Co., Ltd., Kyoto, Japan

[21] Appl. No.: 119,715

[22] Filed: Nov. 12, 1987

[30] Foreign Application Priority Data

Nov. 11, 1986 [JP] Japan .............................. 61-172952[U]

[51] Int. Cl.$^4$ .............................................. G02B 27/00
[52] U.S. Cl. ..................................... 350/169; 350/167
[58] Field of Search ................................ 350/169, 167

[56] References Cited

U.S. PATENT DOCUMENTS

| | | | |
|---|---|---|---|
| 1,882,829 | 10/1932 | Hall ..................................... | 350/167 |
| 3,296,923 | 1/1967 | Miles ................................... | 350/167 |
| 4,402,572 | 9/1983 | Tsunoda et al. ..................... | 350/167 |
| 4,497,015 | 1/1985 | Konno et al. ....................... | 350/167 |

FOREIGN PATENT DOCUMENTS

0226727 10/1986 Japan .................................. 350/169

OTHER PUBLICATIONS

Quenot, J., "Fly's Eye Lenses", IBM Tech. Disc. Bull., Vol. 11, No. 3, August, 1968, p. 220.
Osipou, Yu V., "Multichannel Splitting of a Laser Beam by Means of a Fly's Eye Lens", *Optical Technology*, vol. 40, No. 11, November, 1973, pp. 671-673.

*Primary Examiner*—Bruce Y. Arnold

[57] ABSTRACT

An illumination system includes a light source, an ellipsoidal mirror for converging light emitted from the light source, a fly's eye lens unit disposed at a converging point of the ellipsoidal mirror, a collimation lens for collimating light rays exited from the fly eye lens unit, and an object disposed along the optical path of the illumination system. The fly's eye lens unit includes a first and a second frame defining an incident aperture and an exit one, a plurality of element lenses aligned in a matrix of rows closely in contact with each other, side walls disposed between the first and second frames for housing the element lenses therein, and biasing element for applying a biasing force to the element lenses sideward with respect to the rows of matrix. The respective element lenses are fixedly held without any medium therebetween.

16 Claims, 6 Drawing Sheets

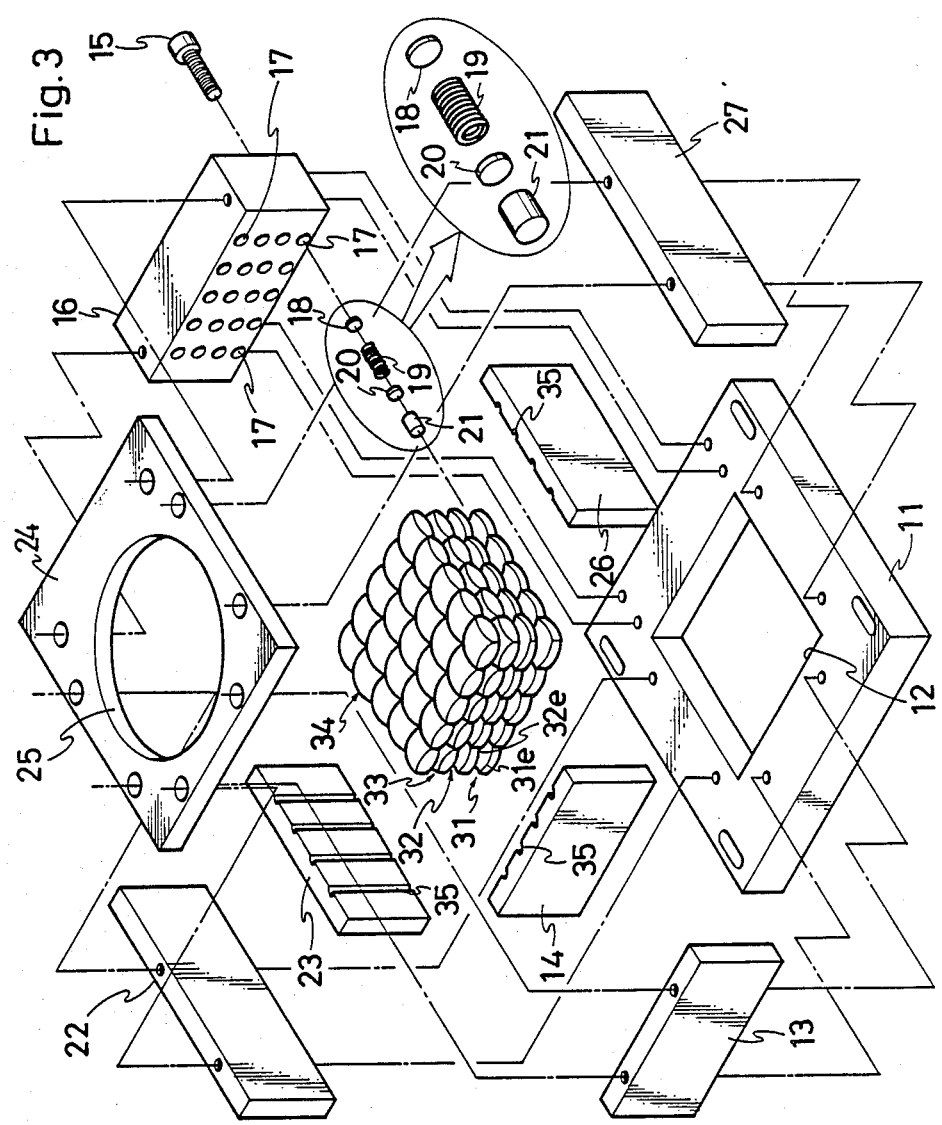

FLY'S EYE LENS UNIT FOR ILLUMINATION SYSTEM

BACKGROUND OF THE INVENTION

The present invention relates generally to a fly's eye lens unit for an illumination system, and more particularly to an assemblage of element lenses for constituting an efficient fly's eye lens unit for use in yielding a uniform irradiance distribution on an object.

It is well known that a fly's eye lens unit is used in an illumination system for use in a proximity or contact exposure of integrated circuit patterns, printed wiring circuit patterns or the like. One of such conventional illumination systems is shown in U.S. Pat. No. 3,296,923 issued to Miles, in which the illumination system includes a light source, a ellipsoidal mirror disposed with respect to the light source, a collimating lens for collimating the light rays emitted from the light source, a cold mirror placed on the optical axis of the system for reflecting the thus collimated light rays, two lenticular lenses with a fly's eye lens structure for a converging effect on the propagated light and an object lens for applying a uniform illumination on an object to be illuminated.

In order to constitute such a fly's eye lens unit as employed in the Miles patent, it is necessary to dispose element lenses of the unit at precise locations in two dimensions perpendicular to the optical axis of the illumination system. Moreover, as can be seen in the Miles patent, it is often required that more than one fly's eye lens unit be used in the form of multiple structure (hereinafter the word "fly's eye lens unit" refers to such a multiple structure of the matrix of element lenses as well as a single structure thereof). In this case, each element lens must be precisely disposed in two dimensions perpendicular to the optical axis, and furthermore each element lens of the matrices must precisely be disposed along the optical axis of the illumination system.

Loss of light should also be considered, when assembling element lenses into a fly's eye lens unit. That is, if the light beam from light source is blocked by any elements constituting the fly's eye lens unit, (e.g. a lens holder for holding respective element lenses or adhesive agent for applying the adhesive effect to respective lenses) light intensity or quantity should be compensated, which will apparently be disadvantageous.

Even if the loss of light can be compensated by increasing the light intensity or quantity of the light source, another problem, i.e. of heat, may be caused. The problem of heat may, of course, be caused even when the light intensity or quantity of the light source is not increased. Since the fly's eye lens unit is often placed at a position that the light beam from the light source is converged, the fly's eye lens unit is heated considerably. If any elements of the fly's eye lens unit (e.g. metallic lens holder elements and element lenses) have different coefficients of thermal expansion, a mechanical distortion may occur, which affects the optical characteristics of the illumination system.

SUMMARY OF THE INVENTION

Accordingly, it is a principal object of the present invention to provide a novel fly's eye lens unit suitable for an illumination system which illuminates an object with a uniform irradiance distribution.

It is another object of the invention to provide a fly's eye lens unit which is easy for assembling element lenses into a single unit and each element lens of which is precisely positioned therein.

It is a further object of the invention to provide a fly's eye lens unit which resolves the problem of heat, where the optical characteristics is kept substantially constant, even if the thermal expansion may occur in the fly's eye lens unit.

It is a further object of the invention to provide an illumination system useful for applying a uniform illumination to an object.

The aforementioned objects are accomplished by the present invention, with a fly's eye lens structure which includes a first frame for defining an incident aperture of the fly's eye lens thereon, a second frame for defining an exit aperture of the fly's eye lens unit thereon, a plurality of element lenses orderly aligned in two-dimensions, said element lenses forming a plurality of rows extending in a predetermined direction and being closely in contact with each other, side walls disposed between said first and second frames for housing said element lenses therein, and biasing means for applying a biasing force to the element lenses sideward with respect to the rows of the element lenses.

The aforementioned fly's eye lens structure is particularly adaptable for an illumination system comprising a light source, converging means disposed with respect to said light source for converging light emitted from the light source, a fly's eye lens unit disposed approximately at a converging point of the converging means, collimating means for collimating light rays exited from the fly's eye lens unit and an object disposed along the optical path of the illumination system.

According to a preferred embodiment, a spacer means is disposed closely between the respective side walls and element lenses. Preferably, the spacer means has heat insulating characteristics and elasticity adaptable for absorbing the thermal expansion of elements of the fly's eye lens unit. The spacer means comprises, for example, a resin plate made of fluorine-containing polymers.

According to a preferred embodiment, a plurality of bores are provided on at least one of the side walls, said bores being defined at positions corresponding to the respective rows of the element lenses, and the biasing means is accommodated in the respective bores.

Preferably, the biasing means comprises a contact member for contacting with an element lenses aligned in a corresponding row of the element lenses, a biasing coil spring for applying a biasing force to a corresponding row of the element lenses and adjusting means for adjusting the biasing force. The contact member has, preferably, heat insulating characteristics and elasticity adaptable for absorbing the thermal expansion of elements of the fly's eye lens unit.

Practically, it is preferable to dispose the element lenses in a matrix of rows, and the element lenses are formed in a plurality of matrices.

Preferably, both the incident aperture and the exit aperture defined on the first and second frames have enough inner diameter not to block light rays received by and passing through the fly's eye lens unit.

Having the aforementioned features, the present invention has the following useful advantages:

Assembling of a fly's eye lens unit can easily be accomplished with precise positioning of the respective element lenses.

Light entering and exiting from the fly's eye lens unit is not be blocked, since there is no intermediate between the respective element lenses, and accordingly substantially all light rays directed toward the fly's eye lens unit can be applied to an object to be illuminated without any loss of light.

The problem of heat can efficiently be resolved, that is, if the fly's eye lens is considerably heated, the heat transmission can efficiently be blocked, and, even if the thermal expansion may occur in the fly's eye lens unit, such thermal expansion can efficiently be absorbed without affecting the optical characteristics of the fly's eye lens.

Other novel features and advantages of the present invention will become apparent in the course of the following detailed description taken together with the accompanying drawings, which are directed only to the understanding of the present invention and not to the restriction of the scope of the invention.

BRIEF DESCRIPTION OF THE DRAWINGS

FIG. 3 is a perspective analytical view of a first embodiment of the fly's eye lens unit shown in FIG. 2;

DETAILED DESCRIPTION OF THE PREFERRED EMBODIMENTS

Figure 1:
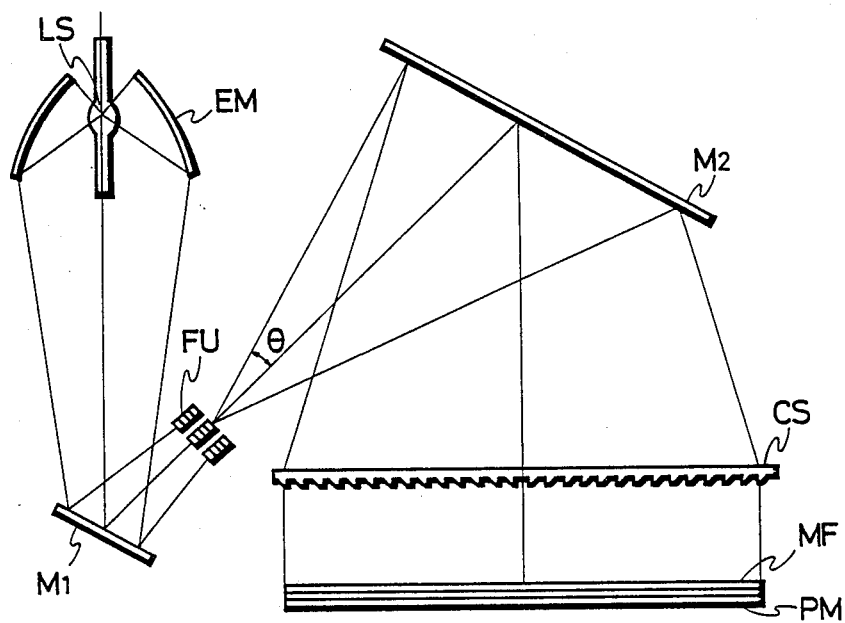
FIG. 1 is a schematic view of an illumination system embodying the present invention.

Referring to FIG. 1, which shows an illumination system embodying the present invention, the illumination system generally comprises a light source LS, an ellipsoidal mirror EM disposed with respect to the light source, a first folding mirror $M_1$, a fly's eye lens unit FU, a second folding mirror $M_2$, a collimation system CS, a mask film MF bearing desired circuit patterns thereon and a photosensitive material PM, respectively disposed along the optical pat in order.

The light source LS is positioned at or adjacent to the first focal point of the ellipsoidal mirror EM, so that light emitted from the light source is condensed and directed to the fly's eye lens unit FU through the folding mirror $M_1$. The folding mirror $M_1$ comprises so-called a cold mirror which allows most of infrared radiation to pass therethrough and reflects most of ultraviolet radiation.

The fly eye lens unit FU is positioned at a point adjacent to the second focal point of the ellipsoidal mirror EM, which is preferred in order to form the secondary light source thereby, since light emitted from the light source is most condensed at this point. However, it is sufficient if the fly's eye lens unit FU is disposed at a position optically nearer to the light source LS, as long as the light directed toward the fly's eye lens unit FU is received within the effective area thereof. Light condensed by the ellipsoidal mirror EM enters the fly's eye lens unit FU to impinge upon the incident surface of the collimation system CS.

The characteristics of the fly's eye lens unit FU as an optical system is designed so that the following equation is substantially established:

$$h = k \tan \theta$$

where h is an entrance height of a light beam, k is a proportional constant and $\theta$ is an exit angle from the fly's eye lens unit.

One such an optical system having the aforementioned characteristics, the detailed description is given in the co-pending U.S. Pat. Application Ser. Nos. 3,957 filed on Jan. 16, 1987 and 62,440 filed on June 12, 1987. Accordingly, the detailed discussion thereof is omitted here.

The fly's eye lens structure is very useful for resolving the irradiance non-uniformity at the entrance pupil of such optical system, which enables the incident surface of the collimation system CS to be illuminated uniformly independent of the irradiance distribution at the entrance pupil. Moreover, respective element lenses of the fly's eye lens unit provide uniform irradiance through the entire area of the incident surface of the collimation system, thus the irradiance distribution on the incident surface of the collimation system will become uniform.

The illumination system shown in FIG. 1 is designed so that the entrance pupil of the fly's eye lens unit FU is conjugated with the incident surface of the collimation system CS, accordingly light passing through a predetermined common point in the entrance pupil will impinge upon a predetermined common point on the incident surface of the collimation system, and consequently light emitted from the light source and received in the entrance pupil will illuminate the predetermined area of the incident surface of the collimation system, without any loss of light.

The collimation system CM comprises a single Fresnel lens, which is advantageous to reduce the optical path between the light source LC and an object to be illuminated. The photosensitive material PM is positioned immediately under the mask film MF, and exposure of a desired circuit pattern is made accurately and effectively on the photosensitive material.

Figure 2:
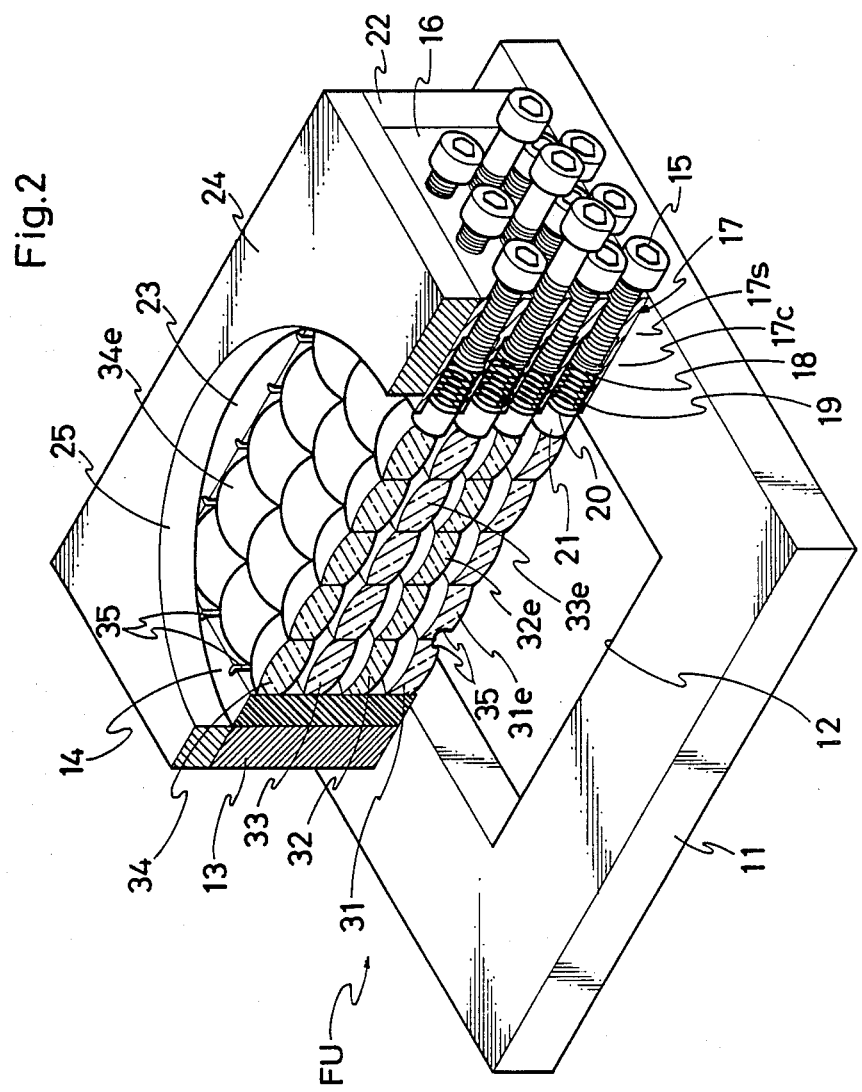
FIG. 2 is a perspective cross-sectional view showing a fly's eye lens unit, in its halved state, embodying the present invention.

Referring to FIGS. 2 and 3, which show a structure outline of a first embodiment of a fly's eye lens unit FU according to the present invention, the fly's eye lens unit generally comprises a base frame 11 defining a square opening 12, side walls 13, 16, 22 and 27, spacer plates 14, 23 and 26, a multiple structure of element lenses 31 to 34, and a lid plate 24 defining a circular opening 25 therein.

The base frame 11 is made of aluminum alloy, and the square opening 12 defined thereon is adapted to pass light rays from a light source. The square opening 12 defines an exit aperture of the fly's eye lens unit FU, which has a large inner diameter so as not to block the light beam exited from the fly's eye lens unit.

The respective side walls 13, 16, 22 and 27 are also made of aluminum alloy, and are secured upright on the respective peripheral edges of the base frame 11. On the side wall 16, there defined are small bores suitable for allowing the insertion of screws 15 therethrough. Each of the bores 17 has a threaded section 17s and a non-threaded cylindrical section 17c therein.

The threads provided in the threaded section 17s is designed to be engageable with those of the screw. The non-threaded section 17c has a larger diameter than that of the threaded section 17s. The non-threaded section 17c accommodates a biasing means comprising a first metal disk 18, a coil spring 19, a second metal disk 20 of the same shape as that of the first disk 18, and a contact element 21 made of fluorine-contained polymers, in order. The respective bores 17 on the side wall 16 are positioned at positions corresponding to respective rows of the element lenses aligned in respect of the corresponding screws 15.

The respective spacer plates 14, 23 and 26 are made of fluorine-containing polymers, and are closely disposed between the respective side walls 1 3, 22 and 27 and the assembly of the element lenses 31 to 34, respectively. It is preferable to chose fluorine-containing polymers as the spacer plates because of their elasticity and heat insulating characteristics. However, it may be also applicable to use any other materials having appropriate elasticity for absorbing the thermal expansion either of the element lenses or metallic base frame and side walls 13, 22 and 27, and having appropriate heat insulating characteristics for blocking the heat transmission from the metallic base frame and side walls to the element lenses, or vice versa.

On the inner surface of the respective side walls, there provided are a plurality of grooves 35 extending in the vertical direction. The positions of the grooves 35 are determined so as to correspond to respective adjacent element lenses on the matrices. Air existing between respective matrices of the element lenses can freely communicate with the outside thereof.

Respective element lenses 31e to 34e constitute four units of matrices 31 to 34, and each of these matrices includes 5 x 5 pieces of element lenses EM. Each matrix of the element lenses is maintained in position only by the biasing forces of the coil springs 19, without any adhesive agent or the like. The biasing force to be applied to each row of element lenses by the corresponding screw 15 is adjusted by the screw, and according to experimental demonstrations it was preferable to apply the biasing force in the range of 1.0 to 1.5 kg to respective rows of the element lenses.

Figures 4A, 4B:
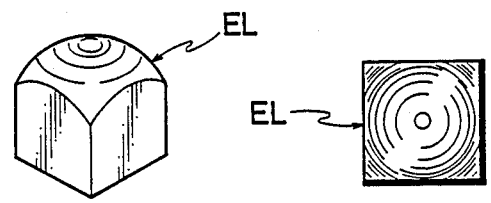
FIGS. 4-A and 4-B are a perspective view and a plane view of an element lens, respectively.

The element lenses in each of the matrices have substantially the same optical characteristics. Each of the element lenses EL has an incident surface and an exit surface having a predetermined curvature, respectively, and four plane side surfaces, as best shown in FIGS. 4-A and 4-B It is especially preferable to form a precise square by the side surfaces in the plane view. The adjacent element lenses in each matrix are closely in contact with each other, without any intervening medium.

The adjacent matrices disposed along the optical axis are spaced from each other by a predetermined distance, where respective optical axes of the element lenses EL in each matrix are precisely coincident with each other. The distance between the adjacent matrices is determined on the basis of the optical characteristics on an object to be illuminated.

The lid plate 24 is also made of aluminum alloy, and defines an circular opening 25 thereon. The circular opening 25 defines an incident aperture of the fly's eye lens unit FU, where the inner diameter of the opening 25 is designed so that the light beam converging on the fly's eye lens unit should not be blocked by the lid plate.

In the aforementioned embodiment, assemblage of the respective element lenses is accomplished only by the biasing forces of the biasing coil springs 19, which are applied to the rows aligned with the screws from a longitudinal direction and are appropriately adjusted only by manipulating respective screws.

Figure 5:
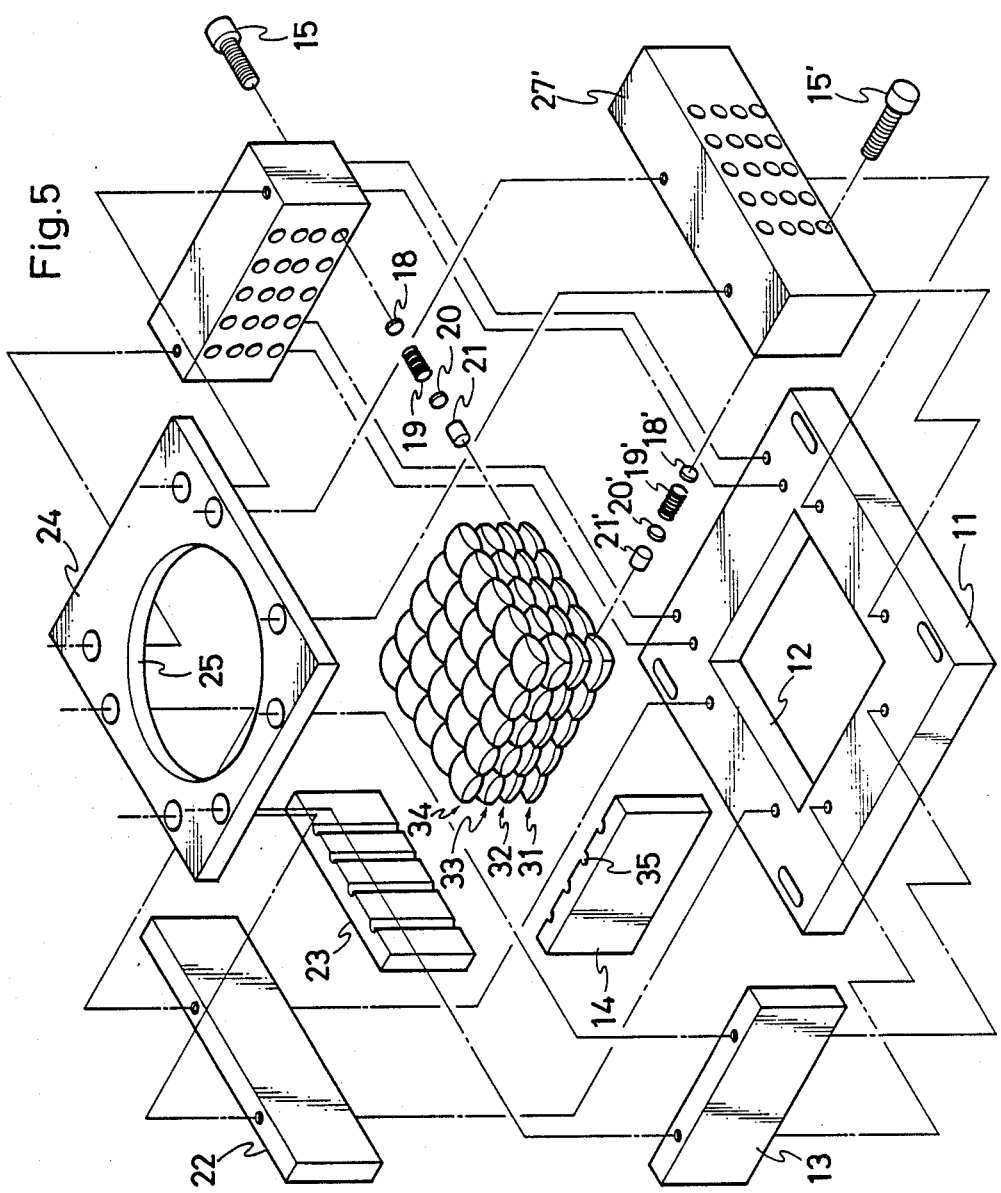
FIG. 5 is a perspective analytical view of a second embodiment of the fly's eye lens unit according to the present invention.

Referring to FIG. 5, which shows a second embodiment of a fly's eye lens unit FU according to the present invention, the same reference numerals as in FIG. 3 denote the same elements. In this embodiment, a side wall 27' is formed substantially in the same manner as the side wall 16, and the spacer plate 26 in FIG. 3 is replaced by assemblies of biasing means as those in FIG. 3, each of which includes screw 15', a first disk plate 18', a coil spring 19', a second disk plate 20' and a contact element 21'. The biasing force applied to the respective rows in respect of the screws 15' is adjusted to be smaller by approximately 500g than that applied to the respective rows of the screws 15.

Figure 6:
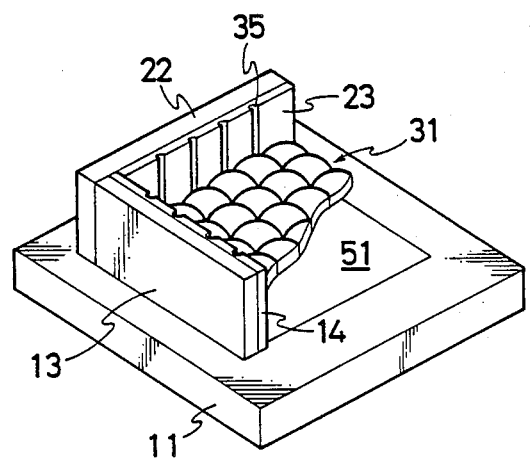
FIGS. 6 through 8 are illustrative views for showing assembling operations of the fly's eye lens unit.
Figure 7:
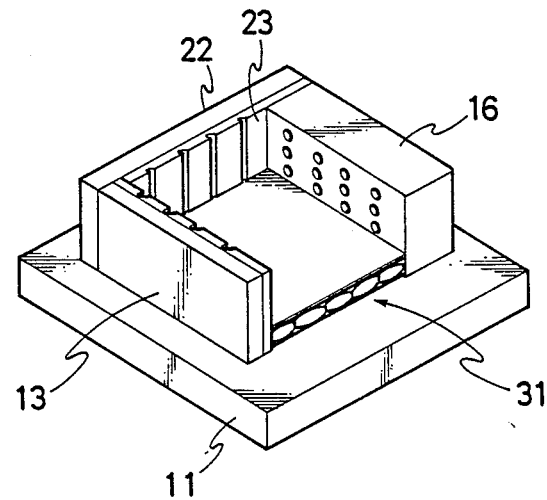
Figure 8:
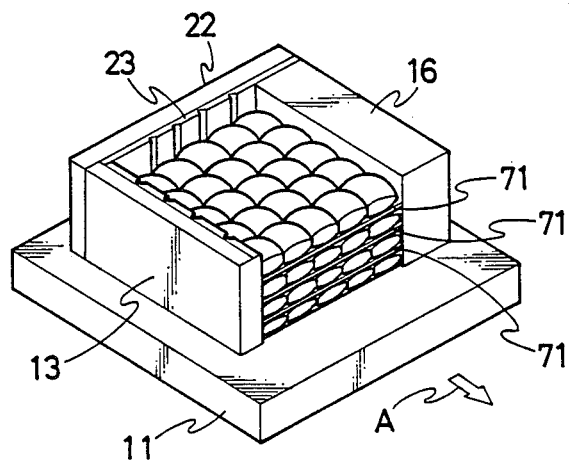

Referring to FIGS. 6 through 8, when assembling the fly's eye lens unit, first both the side walls 13 and 22 are fixed to the base frame 11, and the spacer plates 14 and 23 are mounted along these side walls Then an appropriate square plate 51 corresponding to the square opening 12 is placed within the opening. The fourth (i.e. lowermost) matrix 31 of element lenses are aligned, on the square plate 51, along the side walls 13 and 22. After that, the side wall 16 is mounted to the base frame 11, where the respective bores 17 accommodates a biasing means comprising the contact element 21, the coil spring 19 and a pair of the metal disks 18 and 19. Then, Screws 15 are set to the bores 17, applying the biasing forces to the rows aligned in respect of the screws. Thus, the respective rows of the element lenses is fixedly held by the biasing forces.

Next, as shown in FIG. 7, an adjusting plate 71 is placed on the fourth (i.e. lowermost) matrix 31 of the element lenses, where the adjusting plate 71 has a thickness precisely corresponding to the distance between the fourth matrix 31 of the element lenses and the third matrix 32 thereof. The element lenses of the third matrix 32 are aligned in the same manner as those of the fourth matrix.

In such a manner as above, four matrices of element lenses are superposed in order. Respective rows of the element lenses in the each matrix are fixedly held by the biasing forces. Then, as shown in FIG. 8, the respective adjusting plates 71 interposed between the matrices are drawn in the direction of an arrow A, and are removed from the fly's eye lens unit.

Then, the spacer plate 26 and the side wall 27 are fixedly mounted on the base frame 11, in the case of the first embodiment shown in FIG. 3, or the side wall 27' having substantially the same structure as the side wall 16 is fixedly mounted on the base frame 11, in the case of the second embodiment shown in FIG. 5. After that, the lid plate 24 is mounted on the side walls, whereby assembling of the fly's eye lens unit is accomplished.

As mentioned above, since the fly's eye lens unit FU is positioned at a point adjacent to the second focal point of the ellipsoidal mirror EM, the fly eye's lens unit FU will be heated considerably, in spite of interposition of the cold mirror $M_1$. However, since the spacer plates having heat insulating characteristics are interposed between the element lenses and a housing comprising the base frame, side walls and lid plate of aluminum alloy, the thermal transmission from the housing to the element lenses, or vice versa, is efficiently blocked. Even if the thermal expansion may occur in the fly's eye lens unit, it is efficiently absorbed by the spacer plates 14, 23 and 26 and the biasing means, and accordingly the optical characteristics of the fly's eye lens unit is kept substantially constant.

Since there is no intermediate between respective element lenses of the fly's eye lens unit, light entering the fly's eye lens unit is not blocked and passes therethrough without any loss of light.

Assembling of the fly's eye lens unit can be accomplished with ease and with precise positioning, as can be apparently understood from the aforementioned description.

While the invention has been illustrated and described as embodied an illumination system, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from standpoint of prior art, fairly constitute essential characteristics of the generic or specific aspects of this invention.

What is claimed as new and desired to be protected by Letters Patent is set forth in the appended claims.

1. An illumination system for illuminating an object including a light source, converging means disposed with respect to said light source for converging light emitted from said light source, a fly's eye lens unit disposed at a converging point of said converging means, collimation means for collimating light rays exited from said fly's eye lens unit and an object disposed along the optical path of said illumination system, said fly's eye lens unit comprising:
   a first frame defining an incident aperture;
   a second frame defining an exit aperture;
   a plurality of element lenses orderly aligned in two-dimensions, said element lenses forming a plurality of rows extending in a predetermined direction and being closely in contact with each other;
   side walls disposed between first and second frames for housing said element lenses therein; and
   biasing means for applying a biasing force to the element lenses in the direction of said rows of the element lenses.

2. An illumination system as set forth in claim 1, wherein a plurality of bores are provided on at least one of said side walls, said bores being defined at positions corresponding to the respective rows of the element lenses, and said biasing means being accommodated in the respective bores.

3. An illumination system as set forth in claim 1 or 2, wherein said biasing means comprises a contact member for contacting an element lens aligned in a corresponding row of the element lenses, a biasing coil spring for applying a biasing force to a corresponding row of the element lenses and adjusting means for adjusting the biasing force.

4. An illumination system as set forth in claim 3, wherein said rows of element lenses are formed in a matrix.

5. An illumination system as set forth in claims 4, wherein said element lenses are formed in a plurality of matrices.

6. An illumination system as set forth in claim 3, wherein said adjusting means comprises a screw, and said respective bores each include a threaded section engageable with said screw.

7. An illumination system as set forth in claim 3, wherein said contact member comprises a material having heat insulating characteristics.

8. An illumination system as set forth in claim 3, wherein said contact member comprises a material having an elasticity which can absorb the thermal expansion of the elements of said system.

9. An illumination system as set forth in claim 1, further comprising spacer means disposed closely between said respective side walls and said element lenses.

10. An illumination system as set forth in claim 9, wherein said spacer means comprises a resin plate made of fluorine-contained polymers.

11. An illumination system as set forth in claim 9, wherein said spacer means comprises a material having heat insulating characteristics.

12. An illumination system as set forth in claim 9, wherein said spacer means comprises a material having elasticity which can absorb the thermal expansion of the elements of said system.

13. An illumination system as set forth in any one of claims 9 through 12, wherein a plurality of grooves extend in a direction parallel to the optical axes of the respective element lenses, respective grooves corresponding to borders of respective adjacent element lenses.

14. An illumination system as set forth in claim 1, wherein said incident aperture provided on the first frame has a sufficient inner diameter to receive light rays directed toward the fly's eye lens unit.

15. An illumination system as set forth in claim 1, wherein said exit aperture provided on the second frame has a sufficient inner diameter to pass light rays received in the fly's eye lens unit.

16. A fly's eye lens structure for assembling element lenses into a single unit, comprising:
   a first frame defining an incident aperture of the fly's eye lens;
   a second frame defining an exit aperture of the fly's eye lens;
   a plurality of element lenses orderly aligned in twodimensions, said element lenses forming a plurality of rows extending in a predetermined direction and being closely in contact with each other;
   side walls disposed between first and second frames for housing said element lenses therein; and
   biasing means for applying a biasing force to the element lenses in the direction of said rows of the element lenses.

* * * * *